United States Patent [19]
Moon

[11] Patent Number: 5,648,292
[45] Date of Patent: Jul. 15, 1997

[54] METHOD FOR PREVENTING MICROROUGHNESS AND CONTAMINATION DURING CCD MANUFACTURE

[75] Inventor: Shang Ho Moon, Seoul, Rep. of Korea

[73] Assignee: LG Semicon Co., Ltd., Rep. of Korea

[21] Appl. No.: 432,715

[22] Filed: May 2, 1995

[30]     Foreign Application Priority Data

May 3, 1994 [KR]  Rep. of Korea .................. 9727/1994

[51] Int. Cl.$^6$ .......................... H01L 21/70; H01L 27/00; H01L 21/302; H01L 21/304
[52] U.S. Cl. .................................. 437/53; 437/63
[58] Field of Search ...................... 437/3, 53, 62, 437/63, 64; 257/222, 223, 228, 229, 230, 231, 232, 233, 234, 239, 241, 247, 250

[56]            References Cited
           U.S. PATENT DOCUMENTS 5,028,556  7/1991  Chang ......................... 437/62
5,028,970  7/1991  Masatoshi ............................ 257/232
5,236,862  8/1993  Pfiester et al. .

*Primary Examiner*—Mary Wilczewski
*Assistant Examiner*—Brian K. Dutton

[57]            ABSTRACT

A method of fabricating a charge coupled device (CCD) using etching processes rather than high temperature oxidation to form field regions. The method leaves in place at least one of a first insulation film and a second insulation film that have been formed over the surface of a first conductivity-type semiconductor substrate while (1) injecting channel stop ions into selected regions of a well region to thereby form separation regions between what will become photodiode regions corresponding to pixels of the CCD, while (2) forming a photodiode region for each pixel of said CCD, and while (3) forming charge transfer regions for selectively outputting charges formed at the photodiode regions. The method provides for improved operational performance of the CCD by preventing contamination of the substrate, photodiode regions and charge transfer regions during formation of the CCD.

16 Claims, 5 Drawing Sheets

METHOD FOR PREVENTING MICROROUGHNESS AND CONTAMINATION DURING CCD MANUFACTURE

BACKGROUND OF THE INVENTION

This invention relates to a CCD (Charge Coupled Device), more particularly to a method for fabricating a charge coupled device which is suitable for protection of active regions from contamination caused when field regions and active regions are formed.

In general, a charge coupled device is an image sensor that receives light in the form of an image from an object and converts the light into electrical signals.

Shown in FIG. 1 is a layout of a conventional charge coupled device.

The conventional charge coupled device includes a plurality of photodiode regions PD of a matrix array for receiving light in the form of an image of the object and converting the received image into a video signal, a plurality of vertical charge coupled device regions VCCD, each formed in the vertical direction between the photodiode regions PD in a matrix array for transmitting charge generated at each of the photodiodes in the vertical direction, a horizontal charge coupled device region HCCD formed on one side of the plurality of vertical charge coupled device regions VCCD for transmitting the charge received from the vertical charge coupled device regions VCCD in the horizontal direction, and a sensing amplifier SA formed at an output terminal of the horizontal charge coupled device region HCCD for producing a video signal from the sensed charges.

And, each of the photodiode regions has a channel stop layer (CST) formed around the photodiode region except for a part for transferring the charge to the vertical charge coupled device region VCCD.

Operation of the charge coupled device having the foregoing construction is as follows.

The photodiode region PD, on receiving light of an image of an object, generates charge corresponding to the received light.

The generated charge is transmitted in the vertical direction through the vertical charge coupled device region VCCD according to a clock signal applied from the outside.

The charge transmitted in the vertical direction is transmitted again in the horizontal direction through the horizontal charge coupled device region HCCD.

The charge transmitted in the horizontal direction, on being sensed by the sensing amplifier SA, is then transmitted to the outside as a video signal.

A conventional method for forming a field oxide film, the photodiode regions PD, and the charge coupled device regions in the charge coupled device will now be explained hereinafter, referring to the attached drawings.

FIGS. 2a to 2h are sections across line A—A' of FIG. 1, showing steps of a method for fabricating the conventional charge coupled device.

As shown in FIG. 2a, a first oxide film 3 and a nitride film 4 are deposited, successively, over the surface of an N type silicon substrate 1, and a P type well 2 is formed in a predetermined part of the N type silicon substrate 1 by ion injection.

Then, a first photosensitive film (not shown) is formed all over the surface of the resultant structure. As shown in FIG. 2b, a field region (FR) and an active region (AR) are then defined therein, the nitride film 4 over the field region is selectively removed, and the first photosensitive film is removed.

Then, a second photosensitive film 5 is deposited again over the surface of the resultant structure and is subjected to patterning with exposure and development processes to expose a field ion injection region in the field region, and field ions (P type) are injected into the exposed field ion injection region of the substrate to a concentration ($p^+$) higher than that of the well.

Then, the second photosensitive film 5 is removed and, a field oxide film 6 is selectively grown (as shown in FIG. 2c) in the field region FR using a thermal oxidation process with the nitride film 4 serving as a mask.

As shown in FIG. 2d, the nitride film 4 is then removed.

As shown in FIG. 2e, a third photosensitive film 7 is deposited on the surface of the resultant structure, which is then subjected to exposure and development processes to define channel stop CST layers in the P type well 2 in the active region. The CST layers are used as masks for injecting channel stop ions into the P type well to separate pixels of the CCD.

Thereafter, as shown in FIG. 2f, the third photosensitive film 7 as well as the first oxide film 3 are removed.

As shown in FIG. 2g, a second oxide film 8 is formed in the active region as a buffer layer against ion injection for forming the vertical charge coupled device regions VCCD, the horizontal charge coupled device region (not shown in FIGS. 2a–2h), and the photodiode regions PD.

A fourth photosensitive film (not shown) is deposited over the resultant surface which is then subjected to exposure and development processes to define the areas that will become photodiode regions PD. By injecting N type ions into these areas, the photodiode regions PD are formed.

Then, the fourth photosensitive film is removed and, as shown in FIG. 2h, a fifth photosensitive film 9 is deposited over the resultant surface, which is then subjected to exposure and development processes to define the areas of what will become the vertical charge coupled device regions VCCD, and the horizontal charge coupled device region HCCD. By injecting N type ions thereto, the vertical charge coupled device regions VCCD, and the horizontal charge coupled device region (not shown in FIG. 2h) are formed.

Thereafter, by forming gates for transmitting charges, the charge coupled device can be completed.

However, the foregoing conventional method for fabricating the charge coupled device has had following problems.

First, the picture quality can be degraded seriously due to many white defects in the picture caused by OISF (Oxidation Induced Stacking Fault) coming from oxidation during formation of the field oxidation film, which formation requires a long time period of oxidation at an elevated temperature.

Second, the method is subject to possible contamination due to exposure of the active region because the nitride film grown in an initial stage is removed before the field oxidation process for forming the channel stop layers.

Third, since in the prior art method the buried type CCD regions are formed by growing a new oxide film after removal of the oxide film grown in the initial stage, the surface of the substrate is subject to possible contamination by heavy metals.

Fourth, the conventional method is complicated because the separation between the active region and the field region, the separation between the pixels, and the formation of the channel regions are independently performed.

SUMMARY OF THE INVENTION

The object of this invention, devised for solving the foregoing problems, is to provide a method for fabricating a charge coupled device which can improve quality of the device and simplify the fabricating process by preventing the surface of the substrate from being exposed to the atmosphere while forming each of the separation regions at the same time.

This and other objects and features of this invention can be achieved by providing a method for fabricating a charge coupled device, wherein there is a first process for forming a first insulation film and a second insulation film, successively, on the surface of a first conductivity type semiconductor substrate and forming a well of the second conductivity type having the first ion concentration in a part of the semiconductor substrate, a second process for defining a field region and an active region and selectively removing the second insulation film in the field region and selectively injecting second conduction type field ions into the field region; a third process for depositing a third insulation film over the resultant surface and selectively removing the insulation film to leave the insulation film only within the field region; a fourth process for selectively injecting channel stop ions into separation regions located between pixels in the active region; and a fifth process for defining charge coupled device regions and pixel regions in the active region and selectively injecting first type conduction ions thereto.

DETAILED DESCRIPTION OF THE INVENTION

A method for fabricating a charge coupled device in accordance with this invention is to be explained hereinafter in detail, referring to the attached drawings.

In order to fabricate a high quality charge coupled device, defects should be minimized by inhibiting OISF by shortening the high temperature, long time oxidation process as far as possible, and contamination of the device by heavy metals during the fabricating processes should be minimized by selecting photosensitive films containing fewer heavy metals and avoiding exposure of the substrate surface during the fabricating processes.

Keeping these conditions in mind, the method for fabricating a charge coupled device in accordance with this invention, which allows one to obtain a high quality charge coupled device with simple steps, is as follows.

Figure 1:
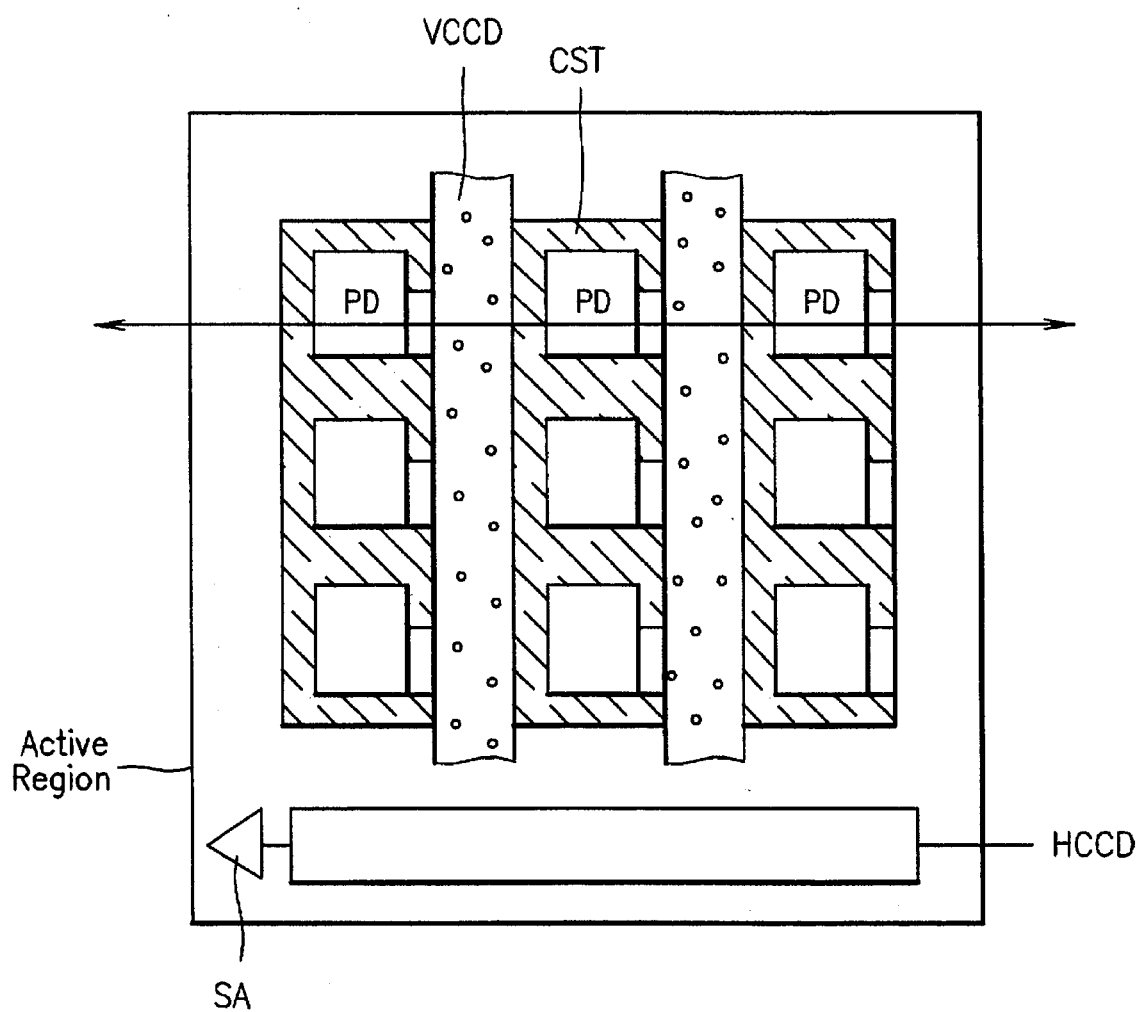
FIG. 1 is a layout of a conventional charge coupled device.
Figure 2A:
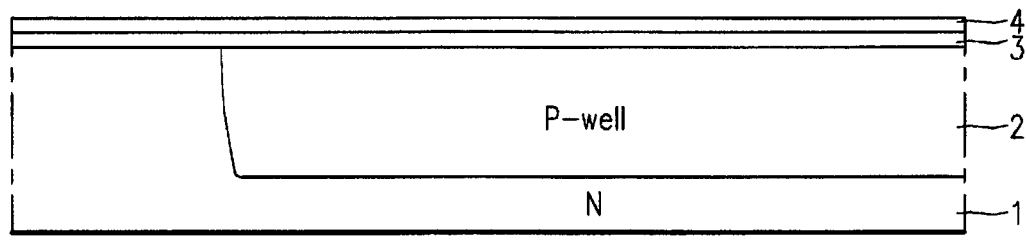
FIGS. 2a to 2h show steps of a conventional method for fabricating a charge coupled device, illustrated in sections across line A—A' of FIG. 1.
Figure 2B:
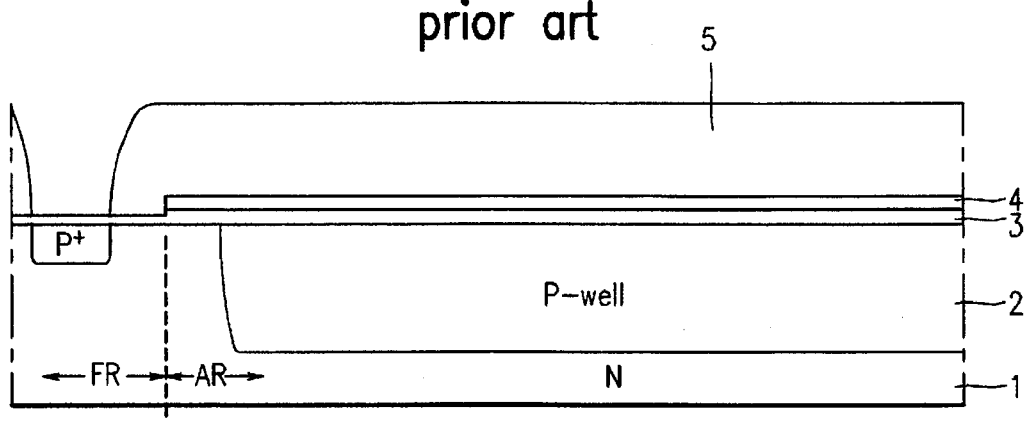
Figure 2C:
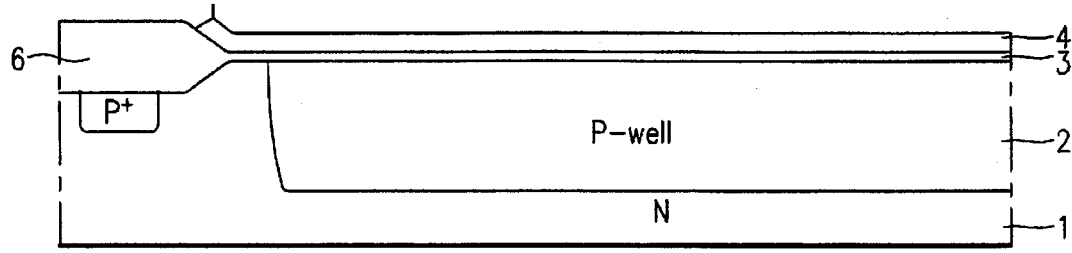
Figure 2D:
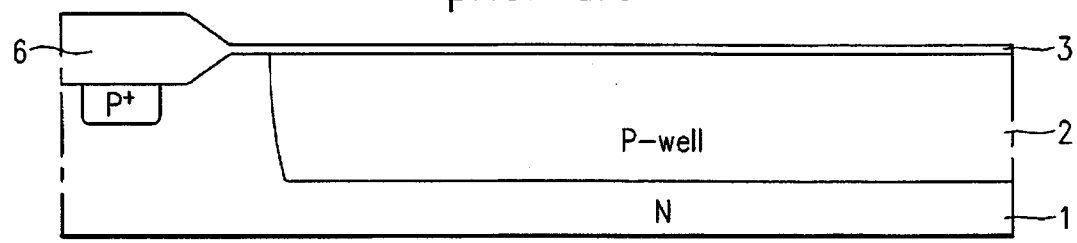
Figure 2E:
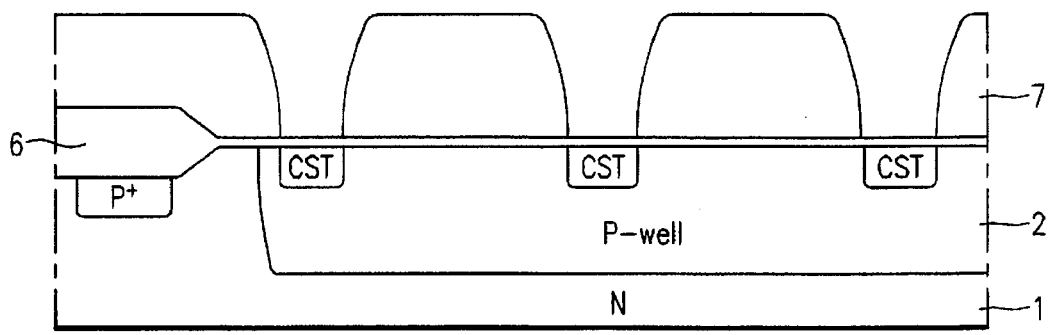
Figure 2F:
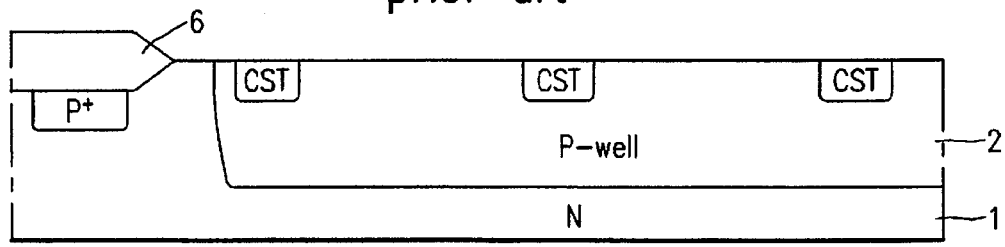
Figure 2G:
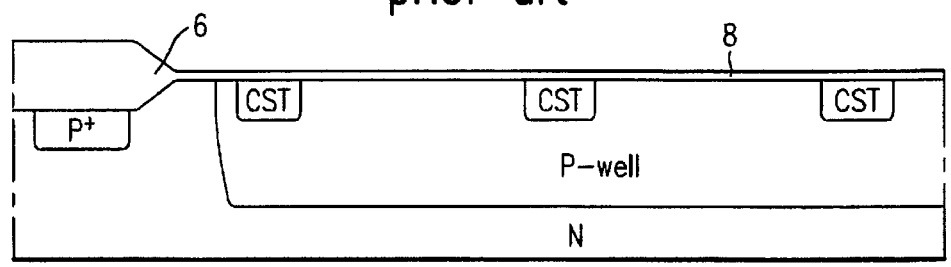
Figure 2H:
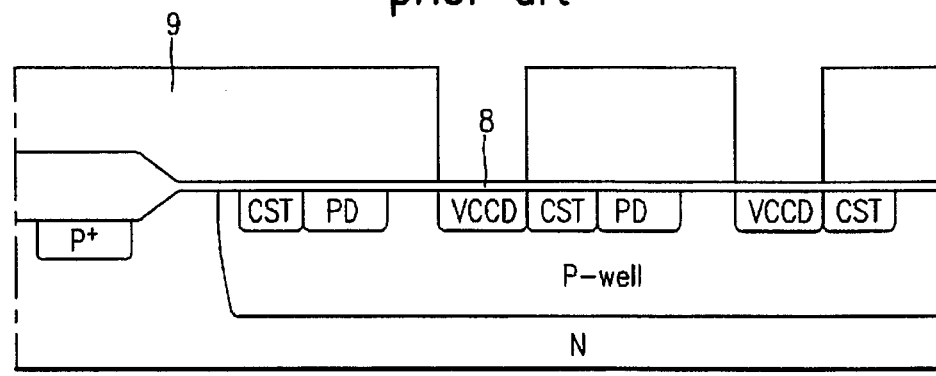

FIGS. 3a to 3h show steps for fabricating a charge coupled device in accordance with this invention, illustrated in sections across line A—A' of FIG. 1.

Figure 3A:
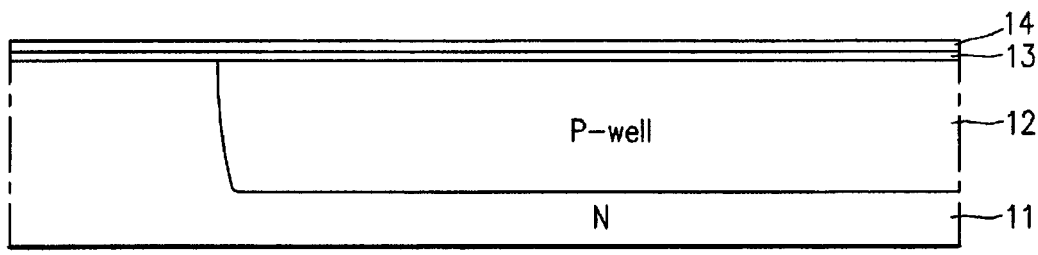
FIGS. 3a to 3h show steps of a method for fabricating a charge coupled device in accordance with this invention, illustrated in sections across line A—A' of FIG. 1.

As shown in FIG. 3a, a first oxide film 13 and a nitride film 14 are deposited, successively, over the surface of an N type silicon substrate 11, and a P type well 12 is formed in a predetermined part of the N type silicon substrate 11 by ion injection.

Figure 3B:
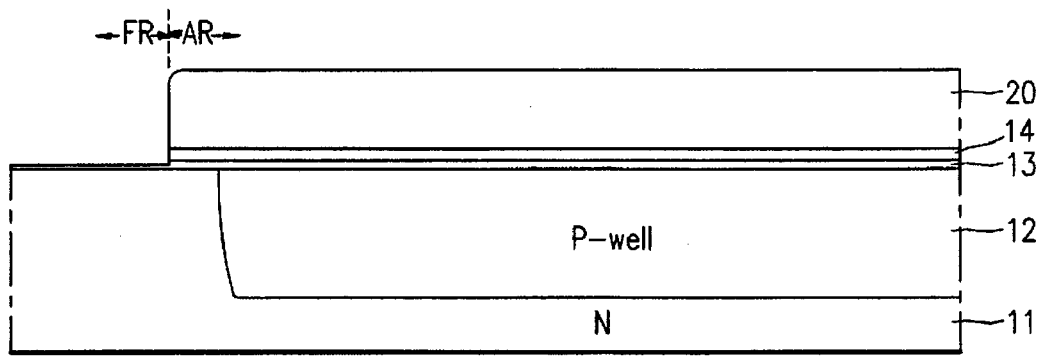

As shown in FIG. 3b, a first photosensitive film 20 is deposited thereon, which is subjected to exposure in a portion thereof and then to development processes. Then the nitride film 14 in the field region is selectively removed so as to define a field region FR (where removed) and an active region AR (where not removed), and the first photosensitive film 20 is also removed.

Figure 3C:
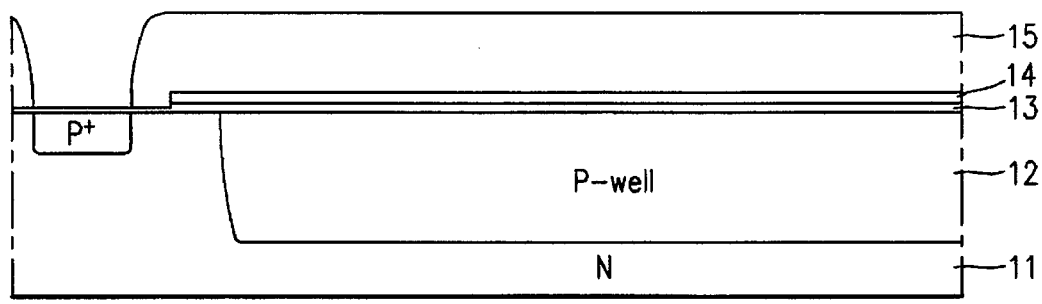

As shown in FIG. 3c, a second photosensitive film 15 is deposited over the surface of the resultant structure and is subjected to exposure and development processes to define a field ion injection region within the field region. P type ions, being an opposite conduction type to the substrate 11 are then injected to a concentration so as to form a $p^+$ region in the field ion injection region.

Figure 3D:
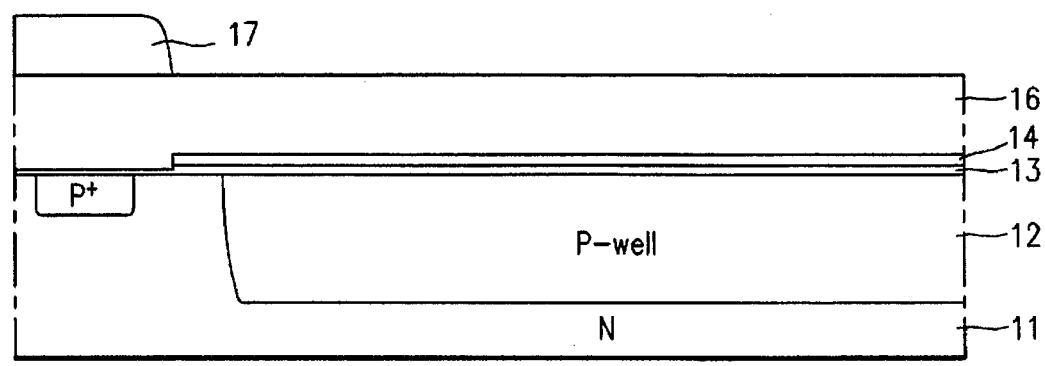

As shown in FIG. 3d, the second photosensitive film 15 is removed, and an HLD (High-Temperature, Low-Temperature, Low-Pressure Dielectric) film 16 is deposited over the surface of the resultant structure, which is then subjected to annealing, and a third photosensitive film 17 is deposited as illustrated, and subjected to exposure and development processes so as to mask the entirety of the field region.

Figure 3E:
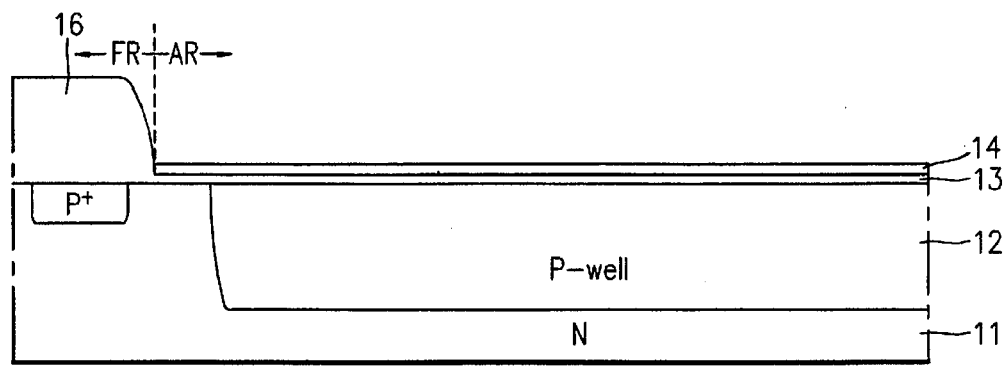

Then, as shown in FIG. 3e, the HLD film 16 on the surface of the active region AR is removed but is not removed in the field region FR.

This time, since the HLD film 16 is removed by wet etching with the nitride film 14 acting as an etch stopper, the active region AR can be protected safely. Subsequently, also as shown in FIG. 3e, the third photosensitive film 17 is removed.

Figure 3F:
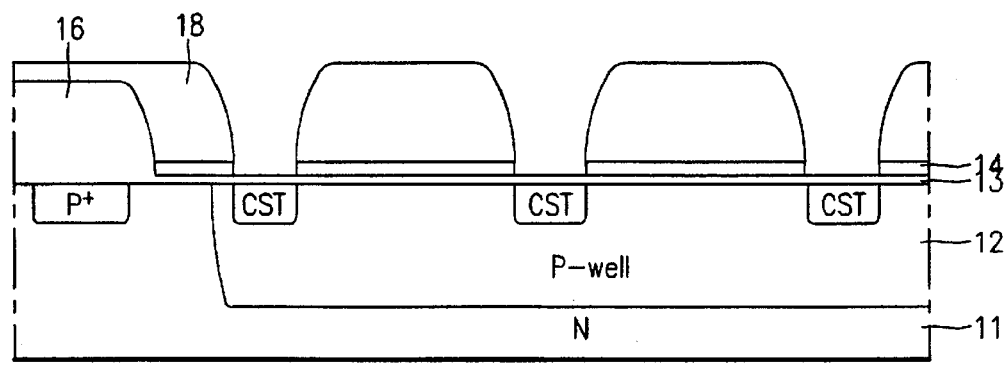

As shown in FIG. 3f, the third photosensitive film 17 has been removed, and a fourth photosensitive film 18 is deposited again on the resultant surface thereof, which is subjected to exposure and development. Then channel stop ions are injected into the substrate 1 so as to form separation regions between what will become pixels.

Herein, channel stop ions may be injected after removal of the nitride film 14 or channel stop ions at a higher ion injection energy, taking into account the thickness of the nitride film 14, may be injected without removing the nitride film 14.

Figure 3G:
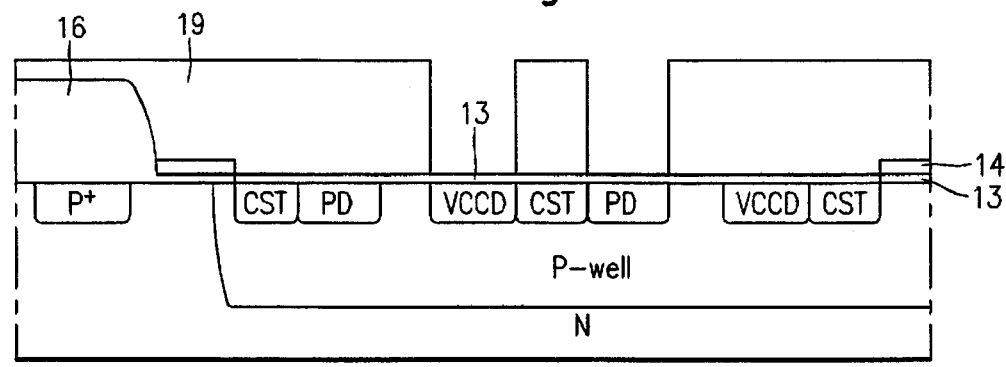

As shown in FIG. 3g, the fourth photosensitive film 18 is removed, and a fifth photosensitive film 19 is deposited, which is subjected to exposure and development processes to define areas for forming the photodiode regions PD. By removing the nitride film 14 in the defined regions and injecting N type impurity ions thereto, the photodiode regions are formed.

Then, the fifth photosensitive film 19 is removed, and a sixth photosensitive film is deposited, which is subjected to exposure and development to define areas for forming the vertical charge coupled device regions VCCD, and the horizontal charge coupled device region (not shown in FIG. 3g).

And, by removing the nitride film 14 from all of the defined regions and injecting N type impurity ions thereto, the vertical charge coupled device regions VCCD, and the horizontal charge coupled device region are formed.

Herein, since the nitride film 14 is removed with a CDE (Chemical Dry Etching) method or with phosphoric acid ($H_3PO_4$), damage to the charge coupled device regions can be minimized, and ions at a higher ion injection energy, taking into account the thickness of the nitride film, may be injected without removing the nitride film.

Figure 3H:
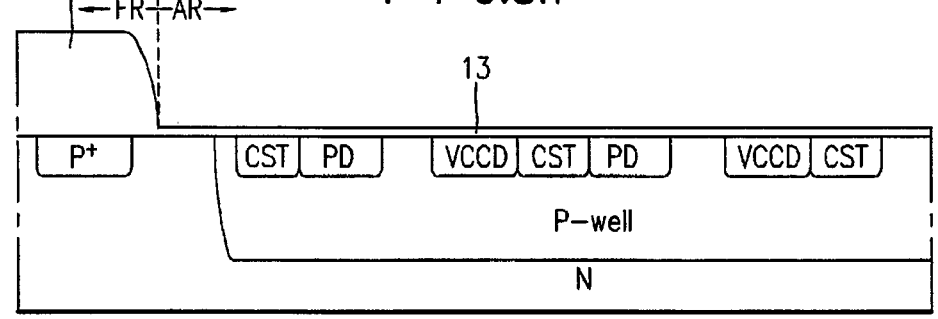

As shown in FIG. 3h, the sixth photosensitive film 19 is removed, and by wet etching (using phosphoric acid) all of the residual nitride film 14, formation of the field region FR and the active region AR is completed.

Then although it has not been shown in the drawings, by forming a gate for transmission of charge, the charge coupled device can be completed.

The method for forming a charge coupled device in accordance with this invention as explained above has the following advantages.

First, using the HLD film as the field oxide film, eliminates the requirement for a high temperature, lengthy oxidation process, and thus OISF caused by oxidation can be prevented and the consequential defects can be reduced.

Second, since the nitride film acts as an etch stopper while forming the field regions, operational characteristics of the device can be improved and a greater process margin for a wet etching step can be provided.

Third, since channel stop regions are formed by defining these regions with the photosensitive film and by injecting ions therein without exposing the surface of the substrate, contamination of the channel stop regions while depositing and removing the photosensitive film can be prevented.

Fourth, since the charge coupled device transfer regions and the photodiode regions are formed without exposing the surface of the substrate, characteristics of the device can be improved.

Fifth, since the fabrication proceeds with the foregoing processes, the light reception part can be protected as the surface is not exposed.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method of fabricating a charge coupled device, the method comprising the steps of:
    a) providing a substrate having a first conductivity-type;
    b) forming a first insulation layer on the substrate;
    c) forming a second insulation layer on the first insulation layer;
    d) forming a well in a portion of the substrate, the well having a second conductivity-type opposite to the first conductivity-type;
    e) selectively removing a portion of the second insulation layer thereby defining a field region where part of the second insulation layer has been removed and defining an active region where another part of the second insulation layer has not been removed;
    f) selectively forming a subregion of the second conductivity-type in the field region;
    g) forming a third insulation layer on the field region and the active region;
    h) selectively removing the third insulation layer in the active region such that the second insulation layer is exposed, the second insulation layer acting as a removal-stopper that protects the well thereunder;
    i) forming separation regions in the well between what will become photodiode regions corresponding to pixels of the charge coupled device;
    j) forming each of the photodiode regions for each of the pixels of the charge coupled device; and
    k) forming charge transfer regions to selectively output charges formed at the photodiode regions.

2. A method as in claim 1, wherein:
the substrate has a first level of ion concentration;
wherein the subregion has a second level of ion concentration; and
wherein the second level of ion concentration is different than the first level of ion concentration.

3. A method as in claim 2, wherein:
the second level of ion concentration is greater than the first level of ion concentration.

4. The method as in claim 1, wherein the step i) includes:
i1) injecting channel stop ions to form separation regions.

5. The method as defined in claim 4, wherein the step i) further includes:
i2) selectively removing the second insulating layer over what will become said separation regions in the substrate before injecting the channel stop ions.

6. The method as in claim 1, wherein the step j) includes:
j1) selectively removing portions of the second insulating layer; and
j2) injecting ions to form the photodiode regions.

7. The method as in claim 1, wherein the step k) includes:
k1) selectively removing portions of the second insulating layer; and
k2) injecting ions to form the charge transfer regions.

8. The method as in claim 1, wherein the step g) includes:
g1) annealing the third layer prior to the step h).

9. A method as in claim 8, wherein:
the third layer is a high temperature and low pressure dielectric.

10. A method as in claim 9, wherein:
the second insulation layer is a nitride film.

11. A method as in claim 8, wherein:
the second insulation layer is a nitride film;
wherein the step h) includes:
    h1) wet etching to remove the third insulation layer; and
wherein the second insulation layer acts as an etch-stopper.

12. A method as in claim 1, wherein the step h) includes:
h1) wet etching to remove the third insulation layer;
wherein the second insulation layer acts as an etch-stopper.

13. A method as in claim 1, wherein:
the first and third insulation layers are oxide films; and
wherein the second insulation layer is a nitride film.

14. A method of fabricating a charge coupled device, the method comprising the steps of:
    a) forming a first insulation film on the surface of a first conductivity type semiconductor substrate having a first ion concentration, forming a second insulation film on the first insulation film, and forming a well of a second conductivity type having the first ion concentration in a part of the semiconductor substrate;
    b) removing the second insulation film in a region to thereby define a field region where the second insulation film is removed and to define an active region where the second insulation film is not removed;
    c) injecting second conductivity type ions into a portion of the field region to an ion concentration higher than the first ion concentration;
    d) depositing a third insulation film on the surface of the structure resulting from the steps a) to c);

e) removing the third insulation film in the active region and leaving the third insulation film in the field region;

f) injecting channel stop ions into regions of the well to thereby form separation regions between what will become photodiode regions corresponding to pixels of the charge coupled device;

g) forming each the photodiode regions for each of the pixels of the charge coupled device by selectively removing first portions of the second insulating film and injecting ions into the well at locations corresponding to where the first portions were removed; and h) forming charge transfer regions to selectively output charges formed at the photodiode regions by selectively removing second portions of the second insulating film and injecting ions into the well at the removed second portions.

15. The method as in claim 14, wherein the third insulating film is subjected to an annealing process before the step e) thereof.

16. A method of fabricating a charge coupled device, the method comprising the steps of:

a) forming a first insulation film on the surface of a first conductivity type semiconductor substrate having a first ion concentration, forming a second insulation layer on the first insulation layer, and forming a well of the second conductivity type having the first ion concentration in a part of the semiconductor substrate;

b) removing the second insulation film in a region to thereby define a field region where the second insulation film is removed and to define an active region where the second insulation film is not removed;

c) injecting second conductivity type ions into a portion of the field region to an ion concentration higher than the first ion concentration;

d) depositing a third insulation film, formed of a dielectric, on the surface of the structure resulting from the steps a) to c);

e) annealing the third insulating film, and then removing the third insulation film in the active region and leaving the third insulation film in the field region by using an etch process with the second insulation film serving as an etch stopper that protects the well thereunder;

f) injecting channel stop ions into regions of the well to thereby form separation regions between what will become photodiode regions corresponding to pixels of the charge coupled device;

g) forming each of the photodiode regions for each of the pixels of the charge coupled device;

h) forming charge transfer regions to selectively output charges formed at the photodiode regions.

* * * * *